(12) United States Patent
Kutsumizu et al.

(10) Patent No.: US 9,929,074 B2
(45) Date of Patent: Mar. 27, 2018

(54) HIGHLY ORIENTED GRAPHITE

(71) Applicant: KANEKA CORPORATION, Osaka-shi, Osaka (JP)

(72) Inventors: Makoto Kutsumizu, Settsu (JP); Yusuke Kato, Settsu (JP); Yasushi Nishikawa, Settsu (JP); Yusuke Ohta, Settsu (JP)

(73) Assignee: KANEKA CORPORATION, Osaka-Shi (JP)

( * ) Notice: Subject to any disclaimer, the term of this patent is extended or adjusted under 35 U.S.C. 154(b) by 0 days.

(21) Appl. No.: 15/118,961

(22) PCT Filed: Jan. 15, 2015

(86) PCT No.: PCT/JP2015/050896
§ 371 (c)(1),
(2) Date: Aug. 15, 2016

(87) PCT Pub. No.: WO2015/129317
PCT Pub. Date: Sep. 3, 2015

(65) Prior Publication Data
US 2017/0053851 A1    Feb. 23, 2017

(30) Foreign Application Priority Data

Feb. 25, 2014  (JP) .................. 2014-034442

(51) Int. Cl.
*H01L 23/373*    (2006.01)
*B32B 18/00*    (2006.01)
(Continued)

(52) U.S. Cl.
CPC .......... *H01L 23/3735* (2013.01); *B32B 18/00* (2013.01); *C01B 32/20* (2017.08);
(Continued)

(58) Field of Classification Search
None
See application file for complete search history.

(56) References Cited

U.S. PATENT DOCUMENTS 5,449,507 A    9/1995  Murakami et al.
9,093,711 B2 *  7/2015  Sheem .................... H01M 4/13
(Continued)

FOREIGN PATENT DOCUMENTS

| JP | 4-202054 A | 7/1992 |
|----|-----------|--------|
| JP | 2004-51447 A | 2/2004 |
| JP | 2004-123506 A | 4/2004 |
| JP | 2008-285362 A | 11/2008 |
| JP | 2011-84470 A | 4/2011 |

OTHER PUBLICATIONS

International Preliminary Report on Patentability and Written Opinion of the International Searching Authority (Forms PCT/IB/338, PCT/IB/373 and PCT/ISA/237) dated Sep. 9, 2016, for International Application No. PCT/JP2015/050896.
(Continued)

*Primary Examiner* — Tahseen N Khan
(74) *Attorney, Agent, or Firm* — Birch, Stewart, Kolasch & Birch, LLP

(57) ABSTRACT

Use of highly oriented graphite including graphite layers placed on top of one another and containing only a small amount of water allows for production of an electronic device that includes, as an element, highly oriented graphite in which no delamination occurs, that is highly reliable in use, and that has a good heat dissipation capability.

6 Claims, 6 Drawing Sheets

(51) Int. Cl.
*C01B 31/04* (2006.01)
*H01L 21/48* (2006.01)
*H01L 23/42* (2006.01)
*C04B 35/52* (2006.01)
*C01B 32/20* (2017.01)

(52) U.S. Cl.
CPC ........ *C04B 35/522* (2013.01); *H01L 21/4803* (2013.01); *H01L 23/373* (2013.01); *H01L 23/42* (2013.01); *C01P 2004/20* (2013.01); *C01P 2006/12* (2013.01); *C01P 2006/82* (2013.01); *C04B 2235/787* (2013.01); *C04B 2237/363* (2013.01); *C04B 2237/704* (2013.01); *C04B 2237/82* (2013.01); *H01L 2924/0002* (2013.01)

(56) References Cited

U.S. PATENT DOCUMENTS

2007/0053168 A1* 3/2007 Sayir .................. B32B 18/00
 361/718
2011/0114342 A1* 5/2011 Ono .................... A62C 2/065
 169/45

OTHER PUBLICATIONS

Interntional Search Report (Form PCT/ISA/210) dated Mar. 31, 2015, for International Application No. PCT/JP2015/050896.
Chinese Notification of the Second Office Action and Search Report (including an English translation thereof) issued in the corresponding Chinese Patent Application No. 201580009408.8 dated Nov. 29, 2017.

* cited by examiner

TOP VIEW

TOP VIEW

HIGHLY ORIENTED GRAPHITE

TECHNICAL FIELD

The present invention relates to highly oriented graphite.

BACKGROUND ART

Recent years have seen a demand for a material having a greater heat-dissipation or heat-transfer property, specifically, highly oriented graphite including layers of graphite (hereinafter referred to as "graphite layers") that are placed on top of one another in a lamination direction over a thickness of not less than 20 mm. Highly oriented graphite is graphite including highly oriented graphite layers, specifically graphite having a thermal conductivity of not less than 800 W/(m·K) in a direction in which the graphite layers are oriented.

Highly oriented graphite is produced by, for example, a method disclosed in Patent Literature 1, that is, a method of (i) placing, on top of one another, polymeric films or carbonaceous films each produced from a polymeric film and (ii) heat-treating the laminated body under pressure to a temperature of not lower than 3000° C. from a temperature region other than the temperature region of 2000° C. to 2600° C.

CITATION LIST

Patent Literature 1

Japanese Patent Application Publication, Tokukaihei, No. 4-202054 A (Publication Date: Jul. 22, 1992)

SUMMARY OF INVENTION

Technical Problem

The method of Patent Literature 1 unfortunately merely allows for production of highly oriented graphite including graphite layers having a thickness of approximately 1.5 to 2 mm in the lamination direction. Further, the method of Patent Literature 1 includes applying a pressure of 200 kg/cm$^2$ to the laminated body in the direction of the lamination of the graphite layers after the laminated body reaches 2600° C. However, applying a high pressure of 200 kg/cm$^2$ at a high temperature of 2600° C. significantly deforms the highly oriented graphite, a container thereof, and/or a jig for pressure application. In a case where the graphite layers have a combined thickness of not less than 20 mm in the lamination direction, the pressure application displaces graphite layers. This has made it impossible to produce highly oriented graphite having a thickness of not less than 20 mm. Further, in a case where highly oriented graphite is used in an electronic device, it is also important to reduce the amount of water absorption of the highly oriented graphite. In a case where highly oriented graphite, which has a layer structure, contains water between layers, heating highly oriented graphite in that state causes layers to be detached from each other due to vapor. This has necessitated reducing the gap between graphite layers, that is, reducing the amount of water absorption of highly oriented graphite.

It is an object of the present invention to provide highly oriented graphite having a thickness of not less than 20 mm and having only a small amount of water absorption.

Solution to Problem

In order to solve the above problem, highly oriented graphite of the present invention is highly oriented graphite, including graphite layers placed on top of one another, the highly oriented graphite having a thickness of not less than 20 mm in a direction of lamination of the graphite layers, a quotient of (i) an amount of water absorption of the highly oriented graphite divided by (ii) an area of lamination surfaces of the graphite layers in the highly oriented graphite being not less than 0.005 mg/cm$^2$ and not more than 6.0 mg/cm$^2$.

In order to solve the above problem, highly oriented graphite of the present invention is highly oriented graphite, including graphite layers placed on top of one another, the highly oriented graphite having a water absorption rate of not less than 0.001% and not more than 1.15%.

In order to solve the above problem, a method of the present invention for producing highly oriented graphite is a method for producing highly oriented graphite, the method including heat-treating a laminated body up to not less than 2400° C. under pressure, the laminated body including a plurality of polymeric films or carbonaceous films placed on top of one another, the method further including a graphitizing step of graphitizing the laminated body, during the graphitizing step, a pressure of not less than 20 kg/cm$^2$ being applied to the laminated body within any temperature range that is at least not less than 2400° C., the pressure being applied to only an area of not more than 92% of a surface of the laminated body which area faces a jig for pressure application.

Advantageous Effects of Invention

The present invention makes it possible to produce highly oriented graphite having a thickness of not less than 20 mm and having only a small amount of water absorption.

DESCRIPTION OF EMBODIMENTS

The present invention provides highly oriented graphite including graphite layers placed on top of one another, the highly oriented graphite having a thickness of not less than 20 mm in the direction of lamination of the graphite layers, the quotient of (i) the amount of water absorption of the highly oriented graphite divided by (ii) the area of lamination surfaces of the graphite layers in the highly oriented graphite being not less than 0.005 mg/cm² and not more than 6.0 mg/cm².

Further, the present invention provides highly oriented graphite including graphite layers placed on top of one another, the highly oriented graphite having a water absorption rate of not less than 0.0010% and not more than 1.15%.

The term "graphite layer" herein refers to graphene.

(Thickness in Lamination Direction of Graphite Layers in Highly Oriented Graphite)

Figure 1:
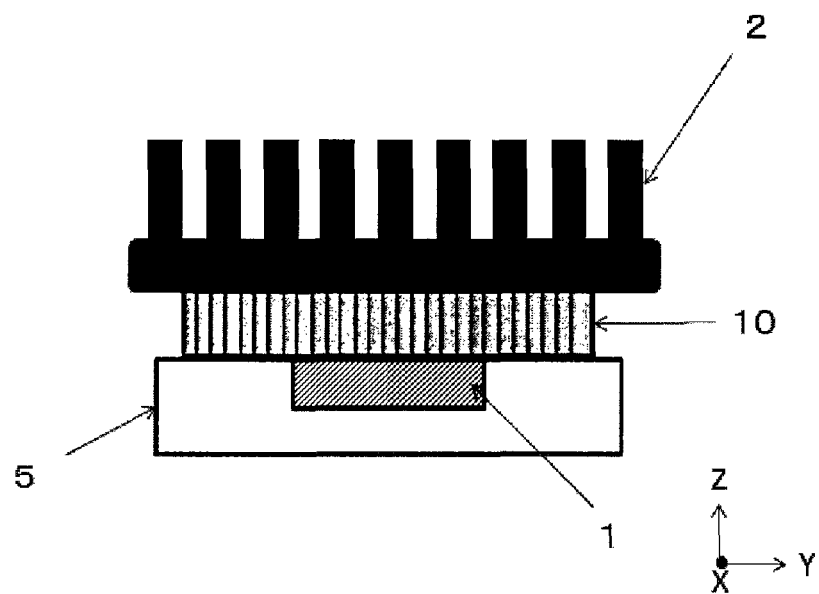
FIG. 1 is a side view of an electronic device, the side view illustrating an example of use of highly oriented graphite in an electronic device.
Figure 2:
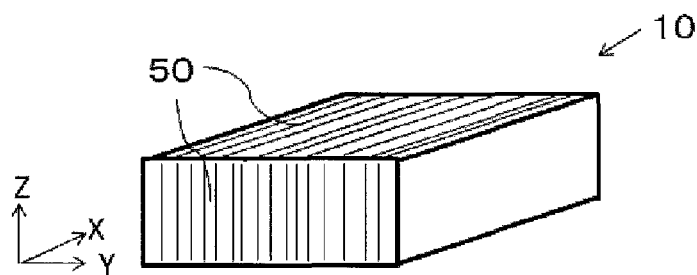
FIG. 2 is a perspective view of highly oriented graphite.

In a case where highly oriented graphite is used in an electronic device such as a semiconductor device, the direction in which the graphite layers are oriented is effectively changed depending on the direction in which heat should be transferred. In particular, in a case where, as illustrated in FIG. 1, highly oriented graphite 10 is disposed between (i) a semiconductor 1 held by a mold resin 5 and serving as a heat source and (ii) a heat sink 2 serving as a cooler, the graphite layers can be oriented in a direction from the heat source to the cooler (Z-axis direction) for efficient transfer of heat of the heat source to the cooler. In this case, the graphite layers are oriented in not only the Z-axis direction but also the X-axis direction. This allows heat to be not only transferred in the Z-axis direction but also dissipated in the X-axis direction to contribute to cooling of the electronic device. FIG. 2 illustrates highly oriented graphite 10, which includes graphite layers 50 oriented in the Z-axis direction and the X-axis direction. This orientation allows heat to be not only transferred in the Z-axis direction but also dissipated in the X-axis direction.

Figure 3:
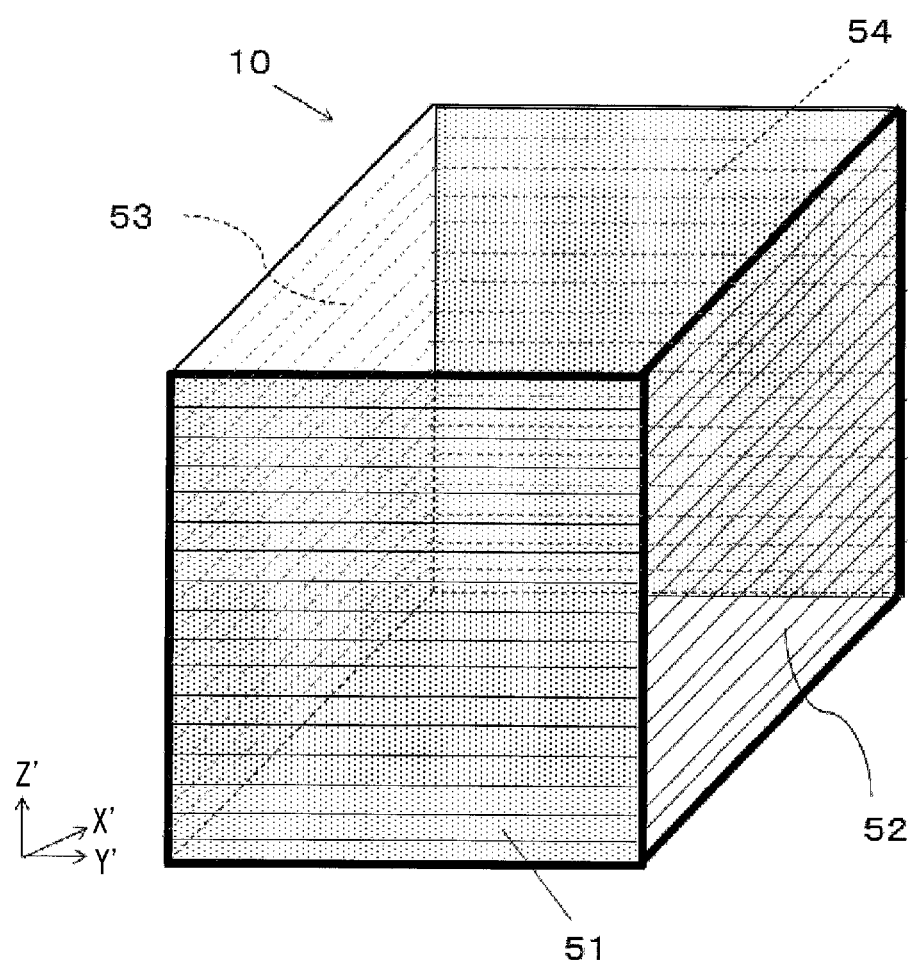
FIG. 3 is a perspective view of highly oriented graphite, the perspective view illustrating lamination surfaces of graphite layers in highly oriented graphite.

Highly oriented graphite oriented highly in the Z-axis direction as illustrated in FIG. 1 is produced by (i) cutting, in a Z'-axis direction, highly oriented graphite oriented in an X'-axis direction and a Y'-axis direction as illustrated in FIG. 3 and (ii) tilting the cutout so that the lamination direction is angled at 90°. The highly oriented graphite 10 is required to be cut out into a square with a side of not less than 20 mm. This is because highly oriented graphite having a size equivalent to the size of the heat sink has great heat-transfer and heat-dissipation effects. In other words, the highly oriented graphite desirably has a side of not less than 20 mm in the direction of the lamination of the graphite layers (Z-axis direction). FIG. 3 defines a space by an X' axis, a Y' axis, and a Z' axis. The space may, however, be defined by other axes; for example, the X' axis in FIG. 3 may be an X axis in FIGS. 1 and 2, the Y' axis in FIG. 3 may be a Z axis in FIGS. 1 and 2, and the Z' axis in FIG. 3 may be a Y axis in FIGS. 1 and 2.

(Quotient of Amount of Water Absorption in Highly Oriented Graphite Divided by Area of Lamination Surfaces of Graphite Layers in Highly Oriented Graphite)

The highly oriented graphite of the present invention has a value obtained by dividing the amount of water absorption of the highly oriented graphite by the combined area of the lamination surfaces of the graphite layers in the highly oriented graphite which value should be preferably not more than 6.0 mg/cm², more preferably not more than 3.0 mg/cm², even more preferably not more than 0.8 mg/cm², most preferably not more than 0.5 mg/cm². The above value is desirably not more than 6.0 mg/cm² because with such a value, delamination of the graphite is prevented. The lamination surfaces of the graphite layers in highly oriented graphite refer to any surface that shows the lamination of the graphite layers as illustrated in FIG. 3. Specifically, the lamination surfaces of the graphite layers correspond to the following four surfaces: (i) a front surface 51 and (ii) a back surface 54, each of which is a YZ plane, and (iii) a right side surface 52 and (iv) a left side surface 53, each of which is an XZ plane.

The highly oriented graphite of the present invention has a value obtained by dividing the amount of water absorption of the highly oriented graphite by the combined area of the lamination surfaces of the graphite layers in the highly oriented graphite which value is preferably not less than 0.005 mg/cm², further preferably not less than 0.006 mg/cm². The highly oriented graphite preferably has a water absorption rate of not less than 0.005 mg/cm² because with such a value, the above lamination surfaces have minute asperities between layers of the graphite, and the highly oriented graphite can thus be joined with another material fitly, with the result of improved adhesiveness between the highly oriented graphite and the other material. Further, the above water absorption rate is preferable because with such a value, the above lamination surfaces have an edge of the graphite and a hydrophilic functional group, and the highly oriented graphite can thus be joined with another material fitly, with the result of improved adhesiveness between the highly oriented graphite and the other material.

In a case where highly oriented graphite is to be used in an electronic device, the highly oriented graphite likely undergoes steps such as plating and soldering. During such steps, the highly oriented graphite comes into contact with liquid. Highly oriented graphite, which includes graphite layers that are particularly highly oriented, hardly allows water to pass through in the direction of the lamination of the graphite layers. Thus, heating highly oriented graphite having absorbed water causes the water to expand. The water, which cannot exit the highly oriented graphite in the direction of the lamination of the graphite layers, pushes up the graphite layers, with the unfortunate result of delamination. Reducing the amount of water absorption that highly oriented graphite absorbs at the lamination surfaces of the graphite layers thus prevents delamination and also facilitates integration into an electronic device.

(Water Absorption Rate of Highly Oriented Graphite)

The highly orientated graphite of the present invention preferably has a water absorption rate of not more than 1.15%, further preferably not more than 0.16%. With such a value, delamination of the graphite can advantageously be prevented.

The highly orientated graphite of the present invention preferably has a water absorption rate of not less than 0.0010%, further preferably not less than 0.0011%. With such a value, the above lamination surfaces have minute asperities between layers of the graphite, and the highly oriented graphite can thus be joined with another material fitly, with the result of improved adhesiveness between the highly oriented graphite and the other material. Further, the above water absorption rate is preferable because with such a value, the above lamination surfaces have an edge of the graphite and a hydrophilic functional group, and the highly oriented graphite can thus be joined with another material fitly, with the result of improved adhesiveness between the highly oriented graphite and the other material.

How the water absorption rate is specifically measured will be described later in the Examples section.

(Thermal Conductivity of Highly Oriented Graphite)

The highly oriented graphite of the present invention preferably has a thermal conductivity of not less than 800 W/(m·K), more preferably not less than 1000 W/(m·K), even more preferably not less than 1500 W/(m·K), in a direction in which the graphite layers are oriented. Highly oriented graphite having a thermal conductivity of not less than 800

W/(m·K) in a direction in which the graphite layers are oriented can advantageously dissipate heat effectively.

The term "highly oriented graphite" herein refers to highly oriented graphite having a thermal conductivity of not less than 800 W/(m·K) in at least one of the directions in which the graphite layers are oriented (stated differently, planar directions).

(Method for Preparing Highly Oriented Graphite)

The highly oriented graphite for use in the present invention is produced by (i) placing a plurality of polymeric films or a plurality of carbonaceous films directly on top of one another and (ii) heating the laminated body up to not less than 2400° C. under pressure.

Specifically, highly oriented graphite is produced through (i) a carbonization step of preheating polymeric films up to a temperature of approximately 1000° C. to prepare carbonaceous films and (ii) a graphitizing step of heating the carbonaceous films, prepared through the carbonization step, up to a temperature of not lower than 2400° C. to graphitize the carbonaceous films. The carbonaceous films prepared through the carbonization step are glassy and have a combined weight that is approximately 60% of the combined weight of the polymeric films. The graphitizing step allows the graphite layers to be rearranged, with the result of high orientation. The carbonization step and the graphitizing step may be arranged such that (i) they are carried out consecutively or that (ii) after the carbonization step ends, the graphitizing step is carried out separately.

Regarding when to place the films on top of one another, a laminated body of a plurality of polymeric films may be carbonized and graphitized, or a laminated body of a plurality of carbonaceous films may be graphitized. However, to reduce the value obtained by dividing the amount of water absorption of the highly oriented graphite by the combined area of the lamination surfaces of the graphite layers in the highly oriented graphite, it is preferable that a laminated body of a plurality of polymeric films is carbonized and graphitized. The description below deals with the carbonization step and the graphitizing step in detail.

(Carbonization Step)

The carbonization step is a step of heating a polymeric film or a plurality of polymeric films placed on top of one another up to a temperature of approximately 1000° C. under load to carbonize the polymeric film or plurality of polymeric films.

The press load during the carbonization step is not limited to any particular value, but preferably falls within the range of 0.1 kg/cm$^2$ to 10 kg/cm$^2$. The load during the carbonization being not less than 0.1 kg/cm$^2$ results in good adhesion between polymeric films and can thus advantageously reduce the amount of water absorption of the highly oriented graphite. Further, the load during the carbonization of not more than 10 kg/cm$^2$ can advantageously prevent a carbonaceous film from breaking due to rapid shrinkage of a polymeric film during the carbonization.

The rate of temperature increase during the carbonization step is not limited to any particular value, but preferably falls within the range of 0.2° C./min to 5° C./min. The rate of temperature increase of not more than 5° C./min allows for slow discharge of cracked gas generated from a polymeric film during the carbonization. In a case where a plurality of polymeric films are placed on top of one another, the rate of temperature increase within the above range allows for prevention of water in the laminated body from pushing up polymeric films. This advantageously makes it possible to produce a laminated body of carbonaceous films in closer contact with one another. Further, the rate of temperature increase of not less than 0.2° C./min allows a polymeric film to be carbonized gradually from the outside thereof and can prevent rapid shrinkage of a polymeric film, thereby preventing breakage of a carbonaceous film.

(Graphitizing Step)

The graphitizing step is a step of heat-treating a carbonaceous-film-laminated body under pressure to a temperature of not lower than 2400° C. to graphitize the carbonaceous-film-laminated body. The carbonaceous-film-laminated body is produced by (i) placing polymeric films on top of one another and carbonizing the laminated body under pressure or (ii) placing a plurality of carbonaceous films directly on top of one another.

Figure 5:
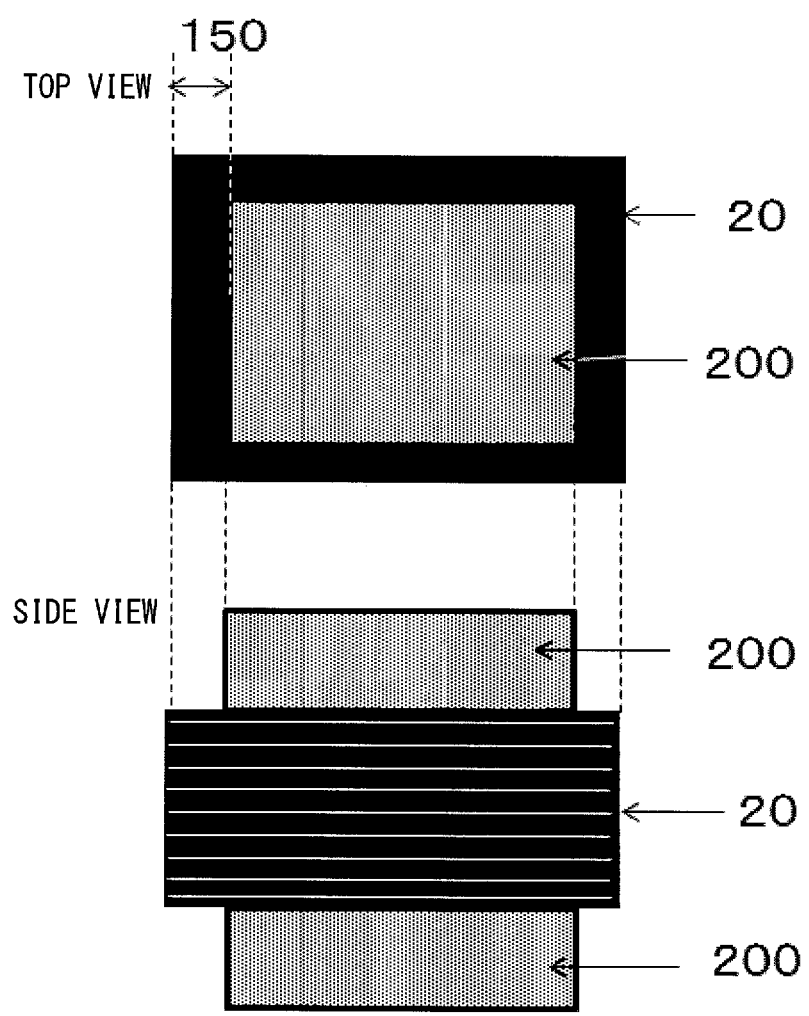
FIG. 5 is a top view of highly oriented graphite, the top view illustrating a pressure application method in a graphitizing step.

In a case where a pressure of not less than 20 kg/cm$^2$ is applied to the laminated body during the graphitizing step, the pressure is desirably applied to only a portion of that surface of the carbonaceous-film-laminated body 20 to be graphitized which faces a jig for pressure application (hereinafter referred to as "pressure application jig") 200 shown in the top-surface view in FIG. 5. That surface of the carbonaceous-film-laminated body 20 which faces the pressure application jig 200 is a surface other than the lamination surfaces (that is, any surface that shows the lamination of the carbonaceous films). The pressure is applied to an area of that surface of the carbonaceous-film-laminated body 20 to be graphitized which faces the pressure application jig 200, the area being preferably not more than 92%, more preferably not more than 80%, even more preferably not more than 70%, most preferably not more than 60%.

Figure 6:
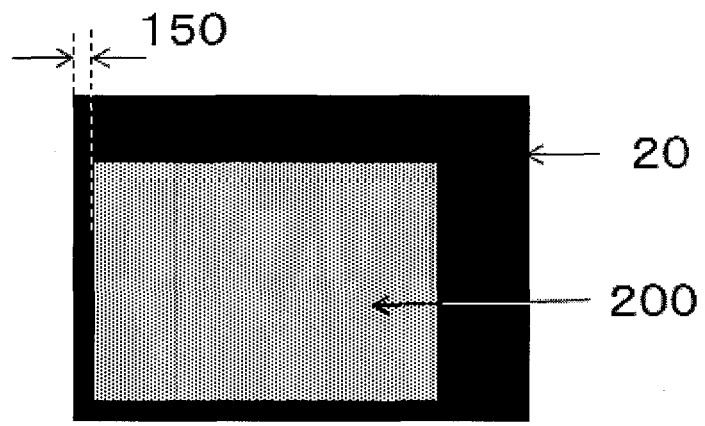
FIG. 6 is a top view of highly oriented graphite, the top view illustrating a pressure application method in a graphitizing step.
Figure 7:
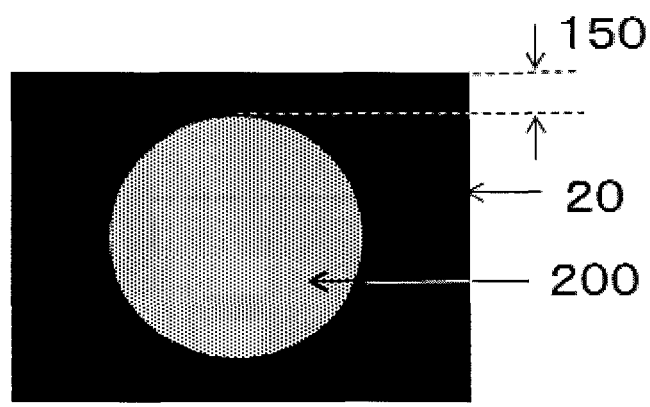
FIG. 7 is a top view of highly oriented graphite, the top view illustrating a pressure application method in a graphitizing step.

In the case where a pressure of not less than 20 kg/cm$^2$ is applied to not more than 92% of the area of a surface of the carbonaceous film facing the pressure application jig, it is possible to prevent displacement of layers during the graphitizing step. It is thus possible to prepare highly oriented graphite having a large thickness of not less than 20 mm in the direction of the lamination of the graphite layers. A layer tends to be significantly displaced in a case where a strong pressure of not less than 20 kg/cm$^2$ is applied and highly oriented graphite is prepared having a large thickness of 20 mm in the direction of the lamination of the graphite layers. Even in the case where the thickness in the direction of the lamination of the graphite layers is as large as 20 mm, a pressure of less than 20 kg/cm$^2$ does not likely cause displacement. Leaving a portion at which a layer is unlikely to be displaced can thus prevent displacement of layers, while applying a pressure of not less than 20 kg/cm$^2$ to the remaining portion can provide highly oriented graphite having a thickness of 20 mm in the direction of the lamination of the graphite layers and having a reduced amount of water absorption. To the portion to which a pressure of not less than 20 kg/cm$^2$ is not applied, a pressure of not more than 10 kg/cm$^2$ is preferably applied. The portion to which a pressure of not less than 20 kg/cm$^2$ is applied should be such that as illustrated in FIG. 5, the carbonaceous-film-laminated body 20 has an end separated from an end of the pressure application jig 200 by a distance 150 of preferably not less than 5 mm, more preferably not less than 8 mm. This can prevent displacement more effectively. The distance 150 from an end of the carbonaceous-film-laminated body refers to the shortest distance between an end of the pressure application jig 200 and an end of the carbonaceous-film-laminated body 20 as illustrated in FIGS. 6 and 7.

The pressure during the graphitizing step is applied within any temperature range that is at least not less than 2400° C., further preferably within any temperature range that is at least not less than 2600° C.

The pressure during the graphitizing step is preferably applied continuously until the graphitizing step ends, but is not necessarily applied continuously until the graphitizing step ends. The graphitizing step may allow the graphitization to progress within the temperature range of not less than 2400° C. under no pressure as long as the graphitizing step includes, for example, applying a pressure at least once within any temperature range that is not less than 2400° C. Such an arrangement is also within the scope of the present invention. More specifically, the present invention may use, for example, (i) a method of graphitizing the laminated body within the temperature range of 2400° C. to 2500° C. under pressure and then allowing the graphitization to progress under no pressure at temperatures of 2500° C. and higher or (ii) a method of allowing the graphitization to progress at temperatures from 2400° C. to 2500° C. under no pressure and then graphitizing the laminated body under pressure at temperatures of 2500° C. and higher.

Further preferable embodiments are as follows: During the temperature rise in the graphitizing step, the pressure is applied preferably continuously from room temperature to the end of the graphitizing step, more preferably continuously from 1400° C. to the end of the graphitizing step, more preferably continuously from 2400° C. to the end of the graphitizing step, more preferably continuously from 2600° C. to the end of the graphitizing step.

The description below deals with a more specific example of the pressure application.

The pressure during the graphitizing step is preferably applied continuously at temperatures of not lower than 1400° C. The pressure is preferably not less than 20 kg/cm$^2$, more preferably not less than 30 kg/cm$^2$, even more preferably not less than 40 kg/cm$^2$. The pressure during the graphitization being not less than 20 kg/cm$^2$ results in good adhesion between layers and can thus advantageously reduce the amount of water absorption of the highly oriented graphite.

The pressure is preferably applied continuously at temperatures of not lower than 1400° C. as described earlier. The graphitizing step causes the graphite layers to be rearranged at temperatures of approximately 1400° C. and higher, which in turn causes molecular chains to be plastic. Applying a pressure of not less than 20 kg/cm$^2$ to the graphite layers in such a state can bring the graphite layers close to one another and connect the graphite layers to one another firmly. Further, at temperatures of not lower than 2400° C., a very small amount of gas remaining in the highly oriented graphite is discharged to the outside. Setting the pressure at not less than 20 kg/cm$^2$ within the above temperature region can prevent the graphite layers from expanding and thus allows for production of highly oriented graphite having only a small amount of water absorption. The pressure is not limited to any particular value at temperatures of lower than 1400° C., and may be not less than 20 kg/cm$^2$.

The rate of temperature increase during the graphitizing step is not limited to any particular value, but preferably falls within the range of 0.2° C./min to 10° C./min. A rate of temperature increase within the above range allows internal gas to be discharged moderately and can advantageously prevent expansion between layers. Preventing the graphite layers from expanding can reduce the amount of water absorption of highly oriented graphite to be produced.

(Polymeric Films)

The polymeric films for use in the present invention are films of at least one polymer selected from a polyimide, a polyamide, a polyoxadiazole, a polybenzothiazole, a polybenzobisthiazole, a polybenzoxazole, a polybenzobisoxasole, a polyparaphenylene vinylene, a polybenzimidazole, a polybenzobisimidazole, and a polythiazole. A particularly preferable raw material film for the graphite film of the present invention is a polyimide film.

The polyimide film for use in the present invention may have any thickness, and is preferably not more than 50 μm, more preferably not more than 25 μm, even more preferably not more than 13 μm. The use of a polyimide film having a thickness of not more than 50 μm can (i) increase the number of interlayer regions, which are necessary to discharge cracked gas generated during the carbonization, (ii) prevent the graphite layers from being lifted up, and (iii) reduce the amount of water absorption of the highly oriented graphite. Further, at temperatures of not lower than 2400° C. during the graphitization, a very small amount of gas remaining in the highly oriented graphite expands. Increasing the number of interlayer regions can promote discharge of such gas and prevent the graphite layers from expanding, thus allowing for production of highly oriented graphite having only a small amount of water absorption.

(Application Purposes)

The highly oriented graphite of the present invention, which is excellent in heat conduction, serves various application purposes related to heat. The highly oriented graphite of the present invention is usable in, for example, semiconductors such as power semiconductors, LEDs, substrates, heat pipes, and the like.

The present invention may alternatively be arranged as below.

The highly oriented graphite of the present invention is preferably arranged such that a quotient of (i) an amount of water absorption of the highly oriented graphite divided by (ii) an area of lamination surfaces of the graphite layers in the highly oriented graphite is not more than 0.8 mg/cm$^2$.

The highly oriented graphite of the present invention is preferably arranged such that the water absorption rate is not more than 0.16%.

EXAMPLES

Evaluations

<Displacement>

Figure 4:
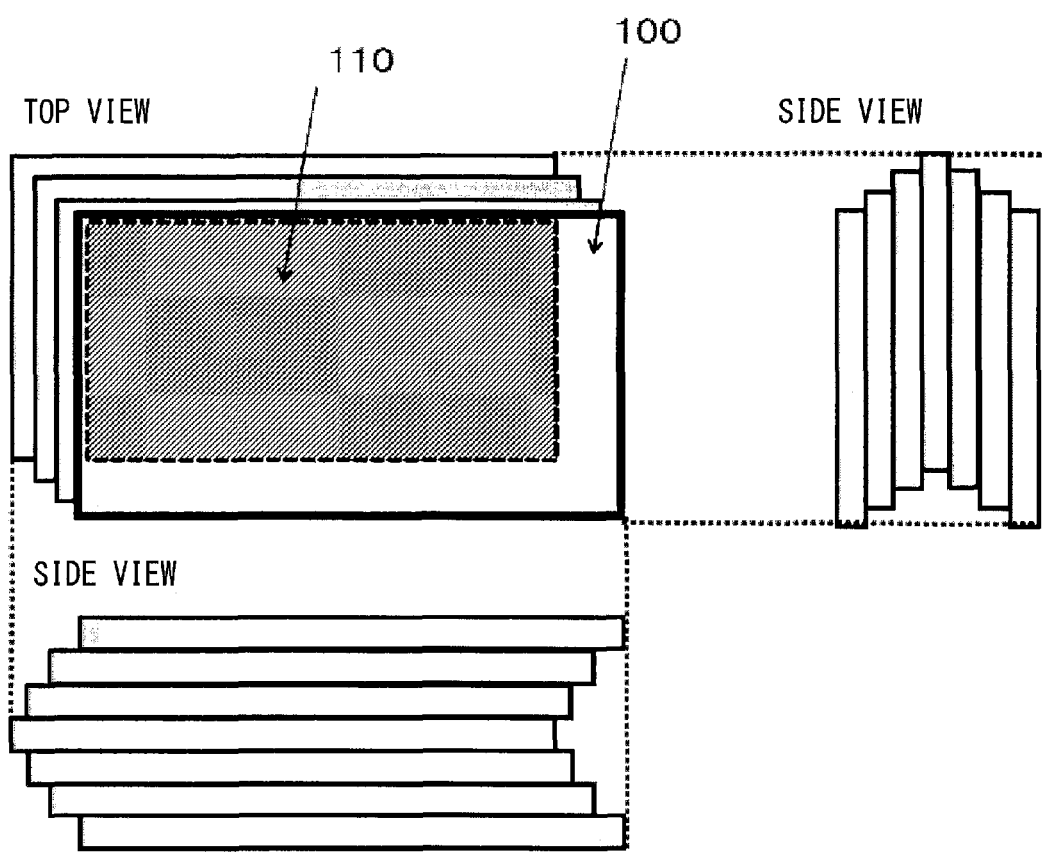
FIG. 4 is a diagram illustrating displacement in highly oriented graphite.

Displacement was evaluated on the basis of the proportion of the area of the uppermost graphite layer to the area of a portion at which displacement had occurred. Specifically, as shown in the top-surface view in FIG. 4, the area of a portion at which displacement had occurred was evaluated on the basis of the quotient of (i) the area of a portion at which displacement had occurred as the laminated body had been graphitized ("the surface area 100 of the uppermost graphite layer"—"the area 110 of a portion at which all graphite layers overlap with one another") divided by (ii) the surface area 100 of the uppermost graphite layer (["the surface area 100 of the uppermost graphite layer"–"the area 110 of a portion at which all graphite layers overlap with one another"]/"the surface area 100 of the uppermost graphite layer"×100).

The highly oriented graphite was rated "A" for a case where the area of a portion at which displacement had occurred was not less than 0% and not more than 10%, "B" for a case where the area of a portion at which displacement had occurred was more than 10% and not more than 25%, "C" for a case where the area of a portion at which displacement had occurred was more than 25% and not more than 40%, or "D" for a case where the area of a portion at which displacement had occurred was more than 40%.

<Evaluation of Quotient of Amount of Water Absorption in Highly Oriented Graphite Divided by Area of Lamination Surfaces of Graphite Layers in Highly Oriented Graphite>

Highly oriented graphite cut out was dried at 70° C. for 5 hours. Then, measurements were made of its initial weight (W1) and size (A) of the lamination surfaces of the graphite layers. After that, the cutout was immersed in 23° C. water for 24 hours. Next, water droplets were wiped off, and a measurement was made of the weight (W2) of the cutout that had absorbed water. The quotient ([W2−W1]/A) was then determined of the amount of water absorbed divided by the area of the lamination surfaces of the graphite layers. The highly oriented graphite was rated "A" for a case where the quotient was not less than 0 mg/cm$^2$ and not more than 0.8 mg/cm$^2$, "B" for a case where the quotient was more than 0.8 mg/cm$^2$ and less than 2.9 mg/cm$^2$, "C" for a case where the quotient was not less than 2.9 mg/cm$^2$ and less than 6.0 mg/cm$^2$, or "D" for a case where the quotient was not less than 6.0 mg/cm$^2$. The above size (A) of the lamination surfaces refers to the total area of four surfaces of the highly oriented graphite (specifically, the front surface 51, the back surface 54, the right side surface 52, and the left side surface 53 each shown in FIG. 3).

<Evaluation of Water Absorption Rate of Highly Oriented Graphite>

Highly oriented graphite cut out was dried at 70° C. for 5 hours. Then, a measurement was made of its initial weight (W1). After that, the cutout was immersed in 23° C. water for 24 hours. Next, water droplets were wiped off, and a measurement was made of the weight (W2) of the cutout that had absorbed water. The water absorption rate ([W2−W1]/W1×100) was then determined.

<Method of Evaluating Delamination>

Highly oriented graphite cut out was immersed in 23° C. water for 24 hours, and was then heated to 100° C. After the heating, the highly oriented graphite was rated "A" for a case where no delamination occurred or "B" for a case where delamination occurred.

<Evaluation of Adhesiveness to Another Material>

Scotch (registered trademark) mending tape was attached to the lamination surfaces of highly oriented graphite cut out and was detached therefrom. An observation was made of the state of a region of the Scotch (registered trademark) mending tape in which region the Scotch (registered trademark) mending tape was attached to the lamination surfaces.

The highly oriented graphite was rated "A" for a case where graphite adhered to substantially the entire region in which the Scotch (registered trademark) mending tape was attached to the lamination surfaces, "B" for a case where graphite adhered to substantially half or more of the region in which the Scotch (registered trademark) mending tape was attached to the lamination surfaces, or "C" otherwise. Graphite adhering to the region in which the Scotch (registered trademark) mending tape was attached to the lamination surfaces indicates excellent adhesiveness to another material.

Example 1

One (1) equivalent of pyromellitic dianhydride was dissolved in a DMF (dimethylformamide) solution in which one (1) equivalent of 4,4'-oxydianiline had been dissolved. This prepared a polyamic acid solution (18.5 wt %). While this solution was being cooled, an imidization catalyst containing one (1) equivalent of acetic anhydride, one (1) equivalent of isoquinoline, and DMF was added to the carboxylic acid group in the polyamic acid for defoaming. Next, this mixed solution was applied to an aluminum foil to form a layer that would have a predetermined thickness (12.5 μm) after being dried. The mixed solution layer on the aluminum foil was dried with use of a hot-air oven and a far-infrared heater. This prepared a polyimide film having a thickness of 12.5 μm.

Figure 8:
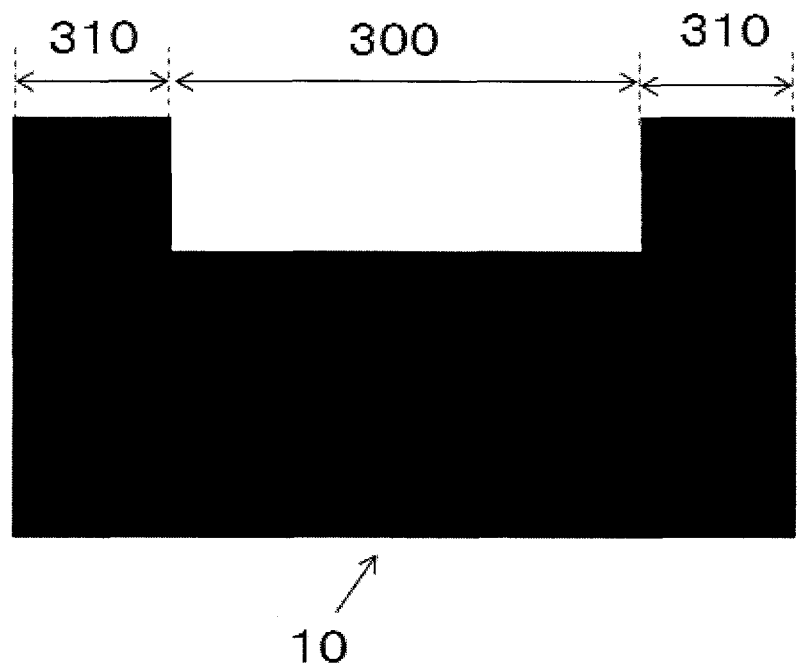
FIG. 8 is a side view of graphitized highly oriented graphite of Example 1.

The polyimide film prepared as above was cut into pieces each having a size of 60 mm×60 mm. Then, 4400 of such pieces were placed on top of one another. Next, a pressure application jig made of graphite was placed on the laminated body to apply a pressure of 0.4 kg/cm$^2$. The laminated body was heated at a rate of temperature increase of 0.5° C./min up to 1400° C. This prepared a carbonaceous-film-laminated body. After that, as illustrated in FIG. 5, a pressure was applied with use of a pressure application jig 200 to only a central portion of the carbonaceous-film-laminated body 20 in a top-surface view which central portion had an area of 30 mm×30 mm (area proportion: 39%), and the carbonaceous-film-laminated body 20 was graphitized. This produced highly oriented graphite. The above pressure was a pressure of 40 kg/cm$^2$ applied continuously during the temperature increase from room temperature to 2900° C. The pressure of 40 kg/cm$^2$ was also applied continuously during cooling down to 1600° C. The rate of temperature increase during graphitization was 5° C./min. That portion of the highly oriented graphite produced to which the pressure had been applied had a size of 30 mm×30 mm and a thickness of 21 mm. Further, as illustrated in FIG. 8, the highly oriented graphite 10 produced was such that the portion 310 to which the pressure had not been applied had a thickness larger than the thickness of the portion 300 to which the pressure had been applied. After that, a central portion of the portion to which the pressure had been applied and which had an area of 30 mm×30 mm was cut out with use of a diamond cutter (ISOMET produced by Buehler) to have a size of 10 mm×10 mm and a thickness of 20 mm. A measurement was then made of the amount of water absorption of the cutout. The amount of water absorption was 0.5 mg/cm$^2$. Table 1 shows the results.

Example 2

A procedure similar to that of Example 1 was carried out except that the pressure was applied during graphitization to only a central portion of the carbonaceous-film-laminated body which central portion had an area of 40 mm×40 mm (area proportion: 69%). That portion of the highly oriented graphite produced to which the pressure had been applied had a size of 40 mm×40 mm and a thickness of 21 mm. The amount of water absorption was 1.1 mg/cm$^2$. Table 1 shows the results.

Example 3

A procedure similar to that of Example 1 was carried out except that the pressure was applied during graphitization to only a central portion of the carbonaceous-film-laminated body in a top-surface view which central portion had an area of 46 mm×46 mm (area proportion: 92%). That portion of the highly oriented graphite produced to which the pressure had been applied had a size of 46 mm×46 mm and a thickness of 21 mm. The amount of water absorption was 3.5 mg/cm$^2$. Table 1 shows the results.

Comparative Example 1

A procedure similar to that of Example 1 was carried out except that the pressure was applied during graphitization to the entire surface (area proportion: 100%) of the carbonaceous-film-laminated body in a top-surface view. The highly oriented graphite produced had a large displacement of layers. This procedure failed to produce highly oriented graphite having a thickness of not less than 20 mm. Since the procedure failed to produce highly oriented graphite having a thickness of not less than 20 mm, a central portion was cut out to have a size of 10 mm×10 mm and a thickness of 10 mm, and the amount of water absorption was measured. The amount of water absorption was 12.1 mg/cm². Table 1 shows the results.

Comparative Example 2

A procedure similar to that of Comparative Example 1 was carried out except that (i) a pressure of 10 kg/cm² was applied continuously during the temperature increase from room temperature to 2900° C. and (ii) a pressure of 10 kg/cm² was also applied continuously during cooling down to 1600° C. The amount of water absorption was 8.0 mg/cm². Table 1 shows the results.

In a case where a pressure was applied during graphitization to the entire surface (100%) of a carbonaceous-film-laminated body in a top-surface view, applying a pressure as large as 10 kg/cm² as in Comparative Example 3 did not cause displacement. In this case, however, the layers were not in sufficiently close contact with one another, thereby leaving slight gaps between layers. Thus, the quotient of (i) the amount of water absorption of the highly oriented graphite produced divided by (ii) the area of the lamination surfaces of the graphite layers in the highly oriented graphite was unfortunately as high as 8.0 mg/cm². Comparative Example 1, in which a pressure of 40 kg/cm² was applied during graphitization to the entire surface (100%) of the carbonaceous-film-laminated body in a top-surface view, resulted unfortunately in a displacement as large as 55%. Such displacement is caused as follows: Gas generated from inside the graphite at temperatures of not lower than 2400° C. cannot be discharged from between the graphite layers due to a strong pressure and pushes up the layers, thereby causing the layers to slide along one another. Applying a

TABLE 1

| | Lamination conditions | | | | | Carbonization conditions | | Size after carbonization | |
| --- | --- | --- | --- | --- | --- | --- | --- | --- | --- |
| | Polymeric film | | Number of lamination | | | Rate of temperature | | | |
| | Kind | Thickness μm | Lamination film | films Films | Thickness mm | Size mm | increase ° C./min | Load kg/cm² | Thickness mm | Size mm |
| Example 1 | PI | 12.5 | PI | 4400 | 55.0 | 60 × 60 | 0.5 | 0.4 | 44 | 48 × 48 |
| Example 2 | PI | 12.5 | PI | 4400 | 55.0 | 60 × 60 | 0.5 | 0.4 | 44 | 48 × 48 |
| Example 3 | PI | 12.5 | PI | 4400 | 55.0 | 60 × 60 | 0.5 | 0.4 | 44 | 48 × 48 |
| Comparative Example 1 | PI | 12.5 | PI | 4400 | 55.0 | 60 × 60 | 0.5 | 0.4 | 44 | 48 × 48 |
| Comparative Example 2 | PI | 12.5 | PI | 4400 | 55.0 | 60 × 60 | 0.5 | 0.4 | 44 | 48 × 48 |

| | Graphitization conditions | | | | Area of portion pressurized | |
| --- | --- | --- | --- | --- | --- | --- |
| | Rate of temperature | Pressure applied | | | | |
| | increase ° C./min | R.T. to 1400° C. kg/cm² | 1400° C. to 2400° C. kg/cm² | 2400° C. to 2900° C. kg/cm² | Size mm | Proportion % |
| Example 1 | 5 | 40 | 40 | 40 | 30 × 30 | 39 |
| Example 2 | 5 | 40 | 40 | 40 | 40 × 40 | 69 |
| Example 3 | 5 | 40 | 40 | 40 | 46 × 46 | 92 |
| Comparative Example 1 | 5 | 40 | 40 | 40 | 48 × 48 | 100 |
| Comparative Example 2 | 5 | 10 | 10 | 10 | 48 × 48 | 100 |

| | Evaluations | | | | | | | | |
| --- | --- | --- | --- | --- | --- | --- | --- | --- | --- |
| | Displacement | | Water absorption | | | | | | |
| | | | Amount of | Water | | | | | |
| | Proportion of displacement % | Evaluation | water absorption W2 − W1 mg | absorption rate (W2 − W1)/W1 * 100 % | Size A of cut surface cm² | Amount of water absorption mg/cm² | Evaluation | Delamination Evaluation | Adhesiveness to another material Evaluation |
| Example 1 | 0 | A | 4.0 | 0.095 | 8.0 | 0.5 | A | A | A |
| Example 2 | 15 | B | 8.8 | 0.210 | 8.0 | 1.1 | B | A | A |
| Example 3 | 30 | C | 28.0 | 0.667 | 8.0 | 3.5 | C | A | A |
| Comparative Example 1 | 55 | D | 48.4 | 2.305 | 4.0 | 12.1 | D | B | A |
| Comparative Example 2 | 0 | A | 32.0 | 1.524 | 4.0 | 8.0 | D | B | A | pressure to only a partial area of a carbonaceous-film-laminated body as in Examples 1 to 3, on the other hand, prevented displacement. This was because there was a portion left to which a weak pressure was applied and at which displacement was thus unlikely to occur. Further, a comparison of Examples 1 to 3 showed that applying a pressure to a smaller area can prevent displacement more effectively. In addition, preventing displacement as such allowed the graphite films to be in closer contact and also reduced the amount of water absorption.

Example 4

A procedure similar to that of Example 2 was carried out except that during graphitization, (i) a pressure of 10 kg/cm² was applied continuously during the temperature increase from room temperature to 2600° C., (ii) a pressure of 200 kg/cm² was then applied from 2600° C. to 2900° C., and (iii) a pressure of 200 kg/cm² was also applied during cooling down to 1600° C. That portion of the highly oriented graphite produced to which the pressure had been applied had a size of 40 mm×40 mm and a thickness of 21 mm. The amount of water absorption was 3.2 mg/cm². Table 2 shows the results.

Comparative Example 3

A procedure similar to that of Example 2 was carried out except that during graphitization, (i) a pressure was applied to the entire surface of a carbonaceous-film-laminated body in a top-surface view, (ii) a pressure of 10 kg/cm² was applied continuously during the temperature increase from room temperature to 2600° C., (iii) a pressure of 200 kg/cm² was then applied from 2600° C. to 2900° C., and (iv) a pressure of 200 kg/cm² was also applied during cooling down to 1600° C. The highly oriented graphite produced had a large displacement of layers. This procedure failed to produce highly oriented graphite having a thickness of not less than 20 mm. Since the procedure failed to produce highly oriented graphite having a thickness of not less than 20 mm, a central portion was cut out to have a size of 10 mm×10 mm and a thickness of 10 mm, and the amount of water absorption was measured. The amount of water absorption was 13.0 mg/cm². Table 2 shows the results.

TABLE 2

| | Lamination conditions | | | | | Carbonization conditions | | Size after carbonization | |
|---|---|---|---|---|---|---|---|---|---|
| | Polymeric film | | Number of lamination | | | Rate of temperature | | | |
| | Kind | Thickness μm | Lamination film | films Films | Thickness mm | Size mm | increase ° C./min | Load kg/cm² | Thickness mm | Size mm |
| Example 4 | PI | 12.5 | PI | 4400 | 55.0 | 60 × 60 | 0.5 | 0.4 | 44 | 48 × 48 |
| Comparative Example 3 | PI | 12.5 | PI | 4400 | 55.0 | 60 × 60 | 0.5 | 0.4 | 44 | 48 × 48 |

| | Graphitization conditions | | | | | |
|---|---|---|---|---|---|---|
| | Rate of temperature | Pressure applied | | | Area of portion pressurized | |
| | increase ° C./min | R.T. to 1400° C. kg/cm² | 1400° C. to 2600° C. kg/cm² | 2600° C. to 2900° C. kg/cm² | Size mm | Proportion % |
| Example 4 | 5 | 10 | 10 | 200 | 40 × 40 | 69 |
| Comparative Example 3 | 5 | 10 | 10 | 200 | 48 × 48 | 100 |

| | Evaluations | | | | | | | | |
|---|---|---|---|---|---|---|---|---|---|
| | Displacement | | Water absorption | | | | | | |
| | | | Amount of water | Water absorption | Size A of | Amount of | | | |
| | Proportion of displacement % | Evaluation | absorption W2 − W1 mg | rate (W2 − W1)/ W1 * 100 % | cut surface cm² | water absorption mg/cm² | Evaluation | Delamination Evaluation | Adhesiveness to another material Evaluation |
| Example 4 | 40 | C | 25.6 | 0.610 | 8.0 | 3.2 | C | A | A |
| Comparative Example 3 | 70 | D | 52.0 | 2.476 | 4.0 | 13.0 | D | B | A |

In a case where the entire surface was pushed in a top-surface view as in Comparative Example 3, applying a pressure as strong as 200 kg/cm² at temperatures of not lower than 2600° C. unfortunately caused displacement even if a reduced pressure of 10 kg/cm² was applied until the temperature reached 2600° C., at which substantially no gas was generated from inside the graphite. This was because temperatures as high as not lower than 2800° C. softened the graphite, thereby deforming the highly oriented graphite, a container thereof, and the pressure application jig. Such deformation likely occurs particularly in a case where highly oriented graphite having a thickness of not less than 20 mm is to be produced. Applying a pressure to only a partial area of a carbonaceous-film-laminated body as in Example 4, on the other hand, prevented displacement.

Comparative Example 4

A procedure similar to that of Example 2 was carried out except that (i) a pressure of 10 kg/cm² was applied continuously during the temperature increase from room temperature to 2900° C. and (ii) a pressure of 10 kg/cm² was also applied continuously during cooling down to 1600° C. The amount of water absorption was 8.0 mg/cm². Table 3 shows the results.

Comparative Example 5

A procedure similar to that of Example 2 was carried out except that (i) a pressure of 15 kg/cm² was applied continuously during the temperature increase from room temperature to 2900° C. and (ii) a pressure of 15 kg/cm² was also applied continuously during cooling down to 1600° C. The amount of water absorption was 6.1 mg/cm². Table 3 shows the results.

Example 5

A procedure similar to that of Example 2 was carried out except that (i) a pressure of 20 kg/cm² was applied continuously during the temperature increase from room temperature to 2900° C. and (ii) a pressure of 20 kg/cm² was also applied continuously during cooling down to 1600° C. The amount of water absorption was 3.2 mg/cm². Table 3 shows the results.

Example 6

A procedure similar to that of Example 2 was carried out except that (i) a pressure of 30 kg/cm² was applied continuously during the temperature increase from room temperature to 2900° C. and (ii) a pressure of 30 kg/cm² was also applied continuously during cooling down to 1600° C. The amount of water absorption was 0.9 mg/cm². Table 3 shows the results.

Example 7

A procedure similar to that of Example 2 was carried out except that (i) a pressure of 70 kg/cm² was applied continuously during the temperature increase from room temperature to 2900° C. and (ii) a pressure of 70 kg/cm² was also applied continuously during cooling down to 1600° C. The amount of water absorption was 0.5 mg/cm². Table 3 shows the results.

Example 13

A procedure similar to that of Example 2 was carried out except that (i) a pressure of 200 kg/cm² was applied continuously during the temperature increase from room temperature to 2900° C. and (ii) a pressure of 200 kg/cm² was also applied continuously during cooling down to 1600° C. The amount of water absorption was 0.006 mg/cm². Table 3 shows the results.

Example 14

A procedure similar to that of Example 2 was carried out except that (i) a pressure of 300 kg/cm² was applied continuously during the temperature increase from room temperature to 2900° C. and (ii) a pressure of 300 kg/cm² was also applied continuously during cooling down to 1600° C. The amount of water absorption was 0.005 mg/cm². Table 3 shows the results.

TABLE 3

| | Polymeric film | | Lamination conditions | | | | Carbonization conditions | | Size after carbonization | |
| --- | --- | --- | --- | --- | --- | --- | --- | --- | --- | --- |
| | Kind | Thickness µm | Lamination film | Number of lamination films Films | Thickness mm | Size mm | Rate of temperature increase ° C./min | Load kg/cm² | Thickness mm | Size mm |
| Comparative Example 4 | PI | 12.5 | PI | 4400 | 55.0 | 60 × 60 | 0.5 | 0.4 | 44 | 48 × 48 |
| Comparative Example 5 | PI | 12.5 | PI | 4400 | 55.0 | 60 × 60 | 0.5 | 0.4 | 44 | 48 × 48 |
| Example 5 | PI | 12.5 | PI | 4400 | 55.0 | 60 × 60 | 0.5 | 0.4 | 44 | 48 × 48 |
| Example 6 | PI | 12.5 | PI | 4400 | 55.0 | 60 × 60 | 0.5 | 0.4 | 44 | 48 × 48 |
| Example 2 | PI | 12.5 | PI | 4400 | 55.0 | 60 × 60 | 0.5 | 0.4 | 44 | 48 × 48 |
| Example 7 | PI | 12.5 | PI | 4400 | 55.0 | 60 × 60 | 0.5 | 0.4 | 44 | 48 × 48 |
| Example 13 | PI | 12.5 | PI | 4400 | 55.0 | 60 × 60 | 0.5 | 0.4 | 44 | 48 × 48 |
| Example 14 | PI | 12.5 | PI | 4400 | 55.0 | 60 × 60 | 0.5 | 0.4 | 44 | 48 × 48 |

| | Graphitization conditions | | | | Area of portion pressurized | |
| --- | --- | --- | --- | --- | --- | --- |
| | Rate of temperature increase ° C./min | Pressure applied R.T. to 1400° C. kg/cm² | 1400° C. to 2400° C. kg/cm² | 2400° C. to 2900° C. kg/cm² | Size mm | Proportion % |
| Comparative Example 4 | 5 | 10 | 10 | 10 | 40 × 40 | 69 |
| Comparative Example 5 | 5 | 15 | 15 | 15 | 40 × 40 | 69 |
| Example 5 | 5 | 20 | 20 | 20 | 40 × 40 | 69 |
| Example 6 | 5 | 30 | 30 | 30 | 40 × 40 | 69 |

TABLE 3-continued

| | | | | | | |
|---|---|---|---|---|---|---|
| Example 2 | 5 | 40 | 40 | 40 | 40 × 40 | 69 |
| Example 7 | 5 | 70 | 70 | 70 | 40 × 40 | 69 |
| Example 13 | 5 | 200 | 200 | 200 | 40 × 40 | 69 |
| Example 14 | 5 | 300 | 300 | 300 | 40 × 40 | 69 |

| | Evaluations | | | | | | | |
|---|---|---|---|---|---|---|---|---|
| | Displacement | | Water absorption | | Size A of cut surface cm² | Amount of water absorption mg/cm² | Evaluation | Delamination Evaluation | Adhesiveness to another material Evaluation |
| | Proportion of displacement % | Evaluation | Amount of water absorption W2 − W1 mg | Water absorption rate (W2 − W1)/W1 * 100 % | | | | | |
| Comparative Example 4 | 0 | A | 64.0 | 1.524 | 8.0 | 8.0 | D | B | A |
| Comparative Example 5 | 0 | A | 48.8 | 1.162 | 8.0 | 6.1 | D | B | A |
| Example 5 | 0 | A | 25.6 | 0.610 | 8.0 | 3.2 | C | A | A |
| Example 6 | 0 | A | 7.2 | 0.171 | 8.0 | 0.9 | B | A | A |
| Example 2 | 0 | A | 4.3 | 0.103 | 8.0 | 0.5 | A | A | A |
| Example 7 | 0 | A | 4.3 | 0.103 | 8.0 | 0.5 | A | A | A |
| Example 13 | 0 | A | 0.048 | 0.0011 | 8.0 | 0.006 | A | A | A |
| Example 14 | 0 | A | 0.040 | 0.0010 | 8.0 | 0.005 | A | A | B |

Applying a pressure as small as 10 kg/cm² or 15 kg/cm² as in Comparative Example 4 or 5 did not cause displacement because gas generated from inside the graphite was discharged through gaps between the graphite layers. However, the layers were in insufficiently close contact with one another, unfortunately resulting in a large amount of water absorption. Applying a pressure of not less than 20 kg/cm² as in Examples 2, 5 through 7, 13 and 14, on the other hand, significantly reduced the amount of water absorption.

Example 8

A procedure similar to that of Example 2 was carried out except that during graphitization, (i) a pressure of 10 kg/cm² was applied continuously during the temperature increase from room temperature to 1400° C., (ii) a pressure of 40 kg/cm² was then applied from 1400° C. to 2900° C., and (iii) a pressure of 40 kg/cm² was also applied during cooling down to 1600° C. That portion of the highly oriented graphite produced to which the pressure had been applied had a size of 40 mm×40 mm and a thickness of 21 mm. The amount of water absorption was 0.8 mg/cm². Table 4 shows the results.

Example 9

A procedure similar to that of Example 2 was carried out except that during graphitization, (i) a pressure of 40 kg/cm² was applied continuously during the temperature increase from room temperature to 1400° C., (ii) a pressure of 10 kg/cm² was then applied from 1400° C. to 2400° C., (iii) a pressure of 40 kg/cm² was applied again from 2400° C. to 2900° C., and (iv) a pressure of 40 kg/cm² was also applied continuously during cooling down to 1600° C. That portion of the highly oriented graphite produced to which the pressure had been applied had a size of 40 mm×40 mm and a thickness of 21 mm. The amount of water absorption was 1.2 mg/cm². Table 4 shows the results.

Example 10

A procedure similar to that of Example 2 was carried out except that during graphitization, (i) a pressure of 10 kg/cm² was applied continuously during the temperature increase from room temperature to 2400° C., (ii) a pressure of 40 kg/cm² was then applied from 2400° C. to 2900° C., and (iii) a pressure of 40 kg/cm² was also applied during cooling down to 1600° C. That portion of the highly oriented graphite produced to which the pressure had been applied had a size of 40 mm×40 mm and a thickness of 21 mm. The amount of water absorption was 2.1 mg/cm². Table 4 shows the results.

Comparative Example 6

A procedure similar to that of Example 2 was carried out except that during graphitization, (i) a pressure of 10 kg/cm² was applied continuously during the temperature increase from room temperature to 1400° C., (ii) a pressure of 40 kg/cm² was then applied from 1400° C. to 2400° C., (iii) a pressure of 10 kg/cm² was applied again from 2400° C. to 2900° C., and (iv) a pressure of 10 kg/cm² was also applied continuously during cooling down to 1600° C. That portion of the highly oriented graphite produced to which the pressure had been applied had a size of 40 mm×40 mm and a thickness of 21 mm. The amount of water absorption was 9.5 mg/cm². Table 4 shows the results.

Comparative Example 7

A procedure similar to that of Example 2 was carried out except that during graphitization, (i) a pressure of 40 kg/cm² was applied continuously during the temperature increase from room temperature to 2400° C., (ii) a pressure of 10 kg/cm² was then applied from 2400° C. to 2900° C., and (iii) a pressure of 10 kg/cm² was also applied during cooling down to 1600° C. That portion of the highly oriented graphite produced to which the pressure had been applied had a size of 40 mm×40 mm and a thickness of 21 mm. The amount of water absorption was 9.2 mg/cm². Table 4 shows the results.

TABLE 4

| | Polymeric film | | Lamination conditions | | | | Carbonization conditions | | Size after carbonization | |
|---|---|---|---|---|---|---|---|---|---|---|
| | | | | Number of lamination | | | Rate of temperature | | | |
| | Kind | Thickness μm | Lamination film | films Films | Thickness mm | Size mm | increase °C./min | Load kg/cm² | Thickness mm | Size mm |
| Example 8 | PI | 12.5 | PI | 4400 | 55.0 | 60 × 60 | 0.5 | 0.4 | 44 | 48 × 48 |
| Example 2 | PI | 12.5 | PI | 4400 | 55.0 | 60 × 60 | 0.5 | 0.4 | 44 | 48 × 48 |
| Example 9 | PI | 12.5 | PI | 4400 | 55.0 | 60 × 60 | 0.5 | 0.4 | 44 | 48 × 48 |
| Example 10 | PI | 12.5 | PI | 4400 | 55.0 | 60 × 60 | 0.5 | 0.4 | 44 | 48 × 48 |
| Comparative Example 6 | PI | 12.5 | PI | 4400 | 55.0 | 60 × 60 | 0.5 | 0.4 | 44 | 48 × 48 |
| Comparative Example 7 | PI | 12.5 | PI | 4400 | 55.0 | 60 × 60 | 0.5 | 0.4 | 44 | 48 × 48 |

| | Graphitization conditions | | | | Area of portion pressurized | |
|---|---|---|---|---|---|---|
| | Rate of temperature | Pressure applied | | | | |
| | increase °C./min | R.T. to 1400° C. kg/cm² | 1400° C. to 2400° C. kg/cm² | 2400° C. to 2900° C. kg/cm² | Size mm | Proportion % |
| Example 8 | 5 | 10 | 40 | 40 | 40 × 40 | 69 |
| Example 2 | 5 | 40 | 40 | 40 | 40 × 40 | 69 |
| Example 9 | 5 | 40 | 10 | 40 | 40 × 40 | 69 |
| Example 10 | 5 | 10 | 10 | 40 | 40 × 40 | 69 |
| Comparative Example 6 | 5 | 10 | 40 | 10 | 40 × 40 | 69 |
| Comparative Example 7 | 5 | 40 | 40 | 10 | 40 × 40 | 69 |

| | Evaluations | | | | | | | |
|---|---|---|---|---|---|---|---|---|
| | Displacement | | Water absorption | | | | | |
| | Proportion of displacement % | Evaluation | Amount of water absorption W2 − W1 mg | Water absorption rate (W2 − W1)/W1 * 100 % | Size A of cut surface cm² | Amount of water absorption mg/cm² | Evaluation | Delamination Evaluation | Adhesiveness to another material Evaluation |
| Example 8 | 0 | A | 6.4 | 0.152 | 8.0 | 0.8 | A | A | A |
| Example 2 | 0 | A | 4.3 | 0.103 | 8.0 | 0.5 | A | A | A |
| Example 9 | 0 | A | 9.6 | 0.229 | 8.0 | 1.2 | B | A | A |
| Example 10 | 0 | A | 16.8 | 0.400 | 8.0 | 2.1 | B | A | A |
| Comparative Example 6 | 0 | A | 76.0 | 1.810 | 8.0 | 9.5 | D | B | A |
| Comparative Example 7 | 0 | A | 73.6 | 1.752 | 8.0 | 9.2 | D | B | A |

Applying a pressure as small as 10 kg/cm² at temperatures of not lower than 2400° C. as in Comparative Examples 6 and 7 did not cause displacement because gas generated from inside the graphite at temperatures of not lower than 2400° C. was discharged through gaps between the graphite layers. However, the layers were in insufficiently close contact with one another, unfortunately resulting in a large amount of water absorption. Applying a strong pressure of 40 kg/cm² at temperatures of not lower than 2400° C. as in Examples 2 and 8 through 10, on the other hand, significantly reduced the amount of water absorption. Further, a comparison between Examples 8 and 9 showed that a pressure should preferably be applied not only in a temperature region of not lower than 2400° C. but also in a temperature region of 1400° C. to 2400° C.

Example 11

A polyimide film (thickness of 12.5 μm) similar to that of Example 1 was cut into pieces each having a size of 60 mm×60 mm. Expanded graphite sheets produced by Toyo Tanso Co., Ltd. (product name: PERMA-FOIL [grade: PF-UHPL], with a thickness of 200 μm) and the polyimide film pieces were placed alternately one by one on top of one another. Next, a pressure application jig made of graphite was placed on the laminated body to apply a pressure of 0.4 kg/cm². The laminated body was heated at a rate of temperature increase of 0.5° C./min up to 1400° C. This prepared a carbonized film. After that, 4400 of such carbonaceous films produced were placed directly on top of one another, and were graphitized while being pressurized under conditions similar to those for Example 2. That portion of the highly oriented graphite produced to which the pressure had been applied had a size of 40 mm×40 mm and a thickness of 21 mm. The amount of water absorption was 5.1 mg/cm². Table 5 shows the results.

TABLE 5

| | Polymeric film | | Lamination conditions | | | | Carbonization conditions | | Size after carbonization | |
|---|---|---|---|---|---|---|---|---|---|---|
| | | | | Number of lamination | | | Rate of temperature | | | |
| | Kind | Thickness μm | Lamination film | films Films | Thickness mm | Size mm | increase ° C./min | Load kg/cm² | Thickness mm | Size mm |
| Example 2 | PI | 12.5 | PI | 4400 | 55.0 | 60 × 60 | 0.5 | 0.4 | 44 | 48 × 48 |
| Example 11 | PI | 12.5 | PI Carbonaceous film | 4400 | 55.0 | 60 × 60 | 0.5 | 0.02 | 44 | 48 × 48 |

| | Graphitization conditions | | | | | |
|---|---|---|---|---|---|---|
| | Rate of temperature | Pressure applied | | | Area of portion pressurized | |
| | increase ° C./min | R.T. to 1400° C. kg/cm² | 1400° C. to 2400° C. kg/cm² | 2400° C. to 2900° C. kg/cm² | Size mm | Proportion % |
| Example 2 | 5 | 40 | 40 | 40 | 40 × 40 | 69 |
| Example 11 | 5 | 40 | 40 | 40 | 40 × 40 | 69 |

| | Evaluations | | | | | | | | |
|---|---|---|---|---|---|---|---|---|---|
| | Displacement | | Water absorption | | | | | | |
| | Proportion of displacement % | Evaluation | Amount of water absorption W2 − W1 mg | Water absorption rate (W2 − W1)/W1 * 100 % | Size A of cut surface cm² | Amount of water absorption mg/cm² | Evaluation | Delamination Evaluation | Adhesiveness to another material Evaluation |
| Example 2 | 0 | A | 4.0 | 0.095 | 8.0 | 0.5 | A | A | A |
| Example 11 | 0 | A | 40.8 | 0.971 | 8.0 | 5.1 | C | A | A |

Regarding when to prepare a laminated body, placing polyimide films (PIs), that is, polymeric films, on top of one another and heat-treating the films under pressure as in Example 2 is advantageous over placing carbonaceous films on top of one another and heat-treating the films under pressure as in Example 11 because the former can improve adhesiveness between the layers and reduce the amount of water absorption.

Example 12

A procedure similar to that of Example 2 was carried out except that 6600 polyimide films were placed on top of one another. That portion of the highly oriented graphite produced to which the pressure had been applied had a size of 40 mm×40 mm and a thickness of 31 mm. The amount of water absorption was 0.7 mg/cm². Table 6 shows the results.

TABLE 6

| | Polymeric film | | Lamination conditions | | | | Carbonization conditions | | Size after carbonization | |
|---|---|---|---|---|---|---|---|---|---|---|
| | | | | Number of lamination | | | Rate of temperature | | | |
| | Kind | Thickness μm | Lamination film | films Films | Thickness mm | Size mm | increase ° C./min | Load kg/cm² | Thickness mm | Size mm |
| Example 7 | PI | 12.5 | PI | 4400 | 55.0 | 60 × 60 | 0.5 | 0.4 | 44 | 48 × 48 |
| Example 12 | PI | 12.5 | PI | 6600 | 82.5 | 60 × 60 | 0.5 | 0.4 | 66 | 48 × 48 |

| | Graphitization conditions | | | | | |
|---|---|---|---|---|---|---|
| | Rate of temperature | Pressure applied | | | Area of portion pressurized | |
| | increase ° C./min | R.T. to 1400° C. kg/cm² | 1400° C. to 2400° C. kg/cm² | 2400° C. to 2900° C. kg/cm² | Size mm | Proportion % |
| Example 7 | 5 | 40 | 40 | 40 | 40 × 40 | 69 |
| Example 12 | 5 | 40 | 40 | 40 | 40 × 40 | 69 |

TABLE 6-continued

| | Evaluations | | | | | | | | |
|---|---|---|---|---|---|---|---|---|---|
| | Displacement | | Water absorption | | | | | | |
| | | | Amount of water | Water absorption | Size A of | Amount of | | | |
| | Proportion of displacement % | Evaluation | absorption W2 − W1 mg | rate (W2 − W1)/ W1 * 100 % | cut surface cm² | water absorption mg/cm² | Evaluation | Delam- ination Evaluation | Adhesiveness to another material Evaluation |
| Example 7 | 0 | A | 4.0 | 0.095 | 8.0 | 0.5 | A | A | A |
| Example 12 | 0 | A | 5.6 | 0.133 | 8.0 | 0.7 | A | A | A |

With a pressure applied partially, even in a case where 6600 polyimide films (PIs) were placed on top of one another (Example 12), it was possible to prevent displacement and produce highly oriented graphite having only a small amount of water absorption as in the case where 4400 polyimide films were placed on top of one another (Example 2).

INDUSTRIAL APPLICABILITY

The highly oriented graphite of the present invention, which is excellent in heat conduction, serves various application purposes related to heat. The highly oriented graphite of the present invention is usable in, for example, semiconductors such as power semiconductors, LEDs, substrates, heat pipes, and the like.

REFERENCE SIGNS LIST 1 semiconductor
2 heat sink
5 mold resin
10 highly oriented graphite
20 carbonaceous-film-laminated body
50 lamination surfaces of graphite layers
51 front surface of highly oriented graphite in FIG. 3
52 right side surface of highly oriented graphite in FIG. 3
53 left side surface of highly oriented graphite in FIG. 3
54 back surface of highly oriented graphite in FIG. 3
150 shortest distance from an end of a portion to which a pressure is applied to an end of a carbonaceous-film-laminated body
100 uppermost graphite layer
110 portion at which all graphite layers overlap with one another
200 pressure application jig
300 portion to which a pressure was applied during graphitization of highly oriented graphite
310 portion to which no pressure was applied during graphitization of highly oriented graphite

The invention claimed is:

1. Highly oriented graphite, comprising
graphite layers placed on top of one another,
the highly oriented graphite having a thickness of not less than 20 mm in a direction of lamination of the graphite layers,
a quotient of (i) an amount of water absorption of the highly oriented graphite divided by (ii) an area of lamination surfaces of the graphite layers in the highly oriented graphite being not less than 0.005 mg/cm² and not more than 6.0 mg/cm².

2. The highly oriented graphite according to claim 1, wherein
the quotient of (i) the amount of water absorption of the highly oriented graphite divided by (ii) the area of lamination surfaces of the graphite layers in the highly oriented graphite is not less than 0.006 mg/cm² and not more than 3.2 mg/cm².

3. Highly oriented graphite, comprising
graphite layers placed on top of one another,
the highly oriented graphite having a thickness of not less than 20 mm in a direction of lamination of the graphite layers,
the highly oriented graphite having a water absorption rate of not less than 0.0010% and not more than 1.15%.

4. The highly oriented graphite according to claim 3, wherein
the water absorption rate is not less than 0.0011% and not more than 0.61%.

5. A method for producing highly oriented graphite,
the highly oriented graphite, comprising:
graphite layers placed on top of one another,
the highly oriented graphite having a thickness of not less than 20 mm in a direction of lamination of the graphite layers,
a quotient of (i) an amount of water absorption of the highly oriented graphite divided by (ii) an area of lamination surfaces of the graphite layers in the highly oriented graphite being not less than 0.005 mg/cm² and not more than 6.0 mg/cm²,
the method comprising
heat-treating a laminated body up to not less than 2400° C. under pressure, the laminated body including a plurality of polymeric films or carbonaceous films placed on top of one another,
the method further comprising
a graphitizing step of graphitizing the laminated body,
during the graphitizing step,
a pressure of not less than 20 kg/cm² being applied to the laminated body within any temperature range that is at least not less than 2400° C.,
the pressure being applied to only an area of not more than 92% of a surface of the laminated body which area faces a jig for pressure application.

6. A method for producing highly oriented graphite,
the highly oriented graphite, comprising
graphite layers placed on top of one another,
the highly oriented graphite having a water absorption rate of not less than 0.0010% and not more than 1.15%,
the method comprising
heat-treating a laminated body up to not less than 2400° C. under pressure, the laminated body including a plurality of polymeric films or carbonaceous films placed on top of one another, the method further comprising a graphitizing step of graphitizing the laminated body, during the graphitizing step, a pressure of not less than 20 kg/cm$^2$ being applied to the laminated body within any temperature range that is at least not less than 2400° C., the pressure being applied to only an area of not more than 92% of a surface of the laminated body which area faces a jig for pressure application.

* * * * *